(12) United States Patent
Lim et al.

(10) Patent No.: US 9,568,517 B2
(45) Date of Patent: Feb. 14, 2017

(54) SELF-DIAGNOSTIC APPARATUS AND METHOD FOR ELECTRIC DEVICE

(71) Applicant: SAMSUNG ELECTRONICS CO., LTD., Suwon-si, Gyeonggi-do (KR)

(72) Inventors: Se Hoon Lim, Gwangju (KR); Hee Jae Jo, Suwon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 689 days.

(21) Appl. No.: 13/734,066

(22) Filed: Jan. 4, 2013

(65) Prior Publication Data

US 2013/0173186 A1  Jul. 4, 2013

(30) Foreign Application Priority Data

Jan. 4, 2012 (KR) .................. 10-2012-0000844

(51) Int. Cl.
| | | |
|---|---|---|
| *G01R 21/00* | (2006.01) | |
| *G06F 17/00* | (2006.01) | |
| *G01R 31/00* | (2006.01) | |

(52) U.S. Cl.
CPC ............. *G01R 21/007* (2013.01); *G01R 31/00* (2013.01); *G06F 17/00* (2013.01); *G01R 21/00* (2013.01)

(58) Field of Classification Search
USPC .......................................................... 702/58
See application file for complete search history.

(56) References Cited

U.S. PATENT DOCUMENTS

| | | | | |
|---|---|---|---|---|
| 4,796,142 A | * | 1/1989 | Libert .................... | H02H 6/005 361/100 |
| 5,910,875 A | * | 6/1999 | Tian ..................... | H02J 13/0048 361/1 |
| 5,921,726 A | | 7/1999 | Shiozaki et al. | |
| 6,260,427 B1 | | 7/2001 | Jones et al. | |
| 6,594,589 B1 | | 7/2003 | Coss, Jr. et al. | |
| 2007/0121259 A1 | * | 5/2007 | Kuivalainen .......... | H02H 6/005 361/25 |
| 2011/0316335 A1 | | 12/2011 | Bretschneider et al. | |

FOREIGN PATENT DOCUMENTS

| | | | |
|---|---|---|---|
| JP | 2009-083527 | * | 4/2009 |
| KR | 10-2010-0075283 | | 7/2010 |

OTHER PUBLICATIONS

European Search Report of corresponding Patent Application No. EP 12 19 9444 dated May 2, 2013.

* cited by examiner

Primary Examiner — Tung Lau

(57) ABSTRACT

A diagnostic method and apparatus for self-diagnosis a load side of an electric device to detect the occurrence of the abnormal electricity usage at the load using a simple apparatus based on a current sensor includes checking rated power consumption of a load, measuring power consumption of the load in operation, calculating a change in the power consumption by comparing the rated power consumption of the load with the power consumption of the load in operation, and determining that an abnormal power consumption occurs at the load when the change in the power consumption is outside a predetermined range.

6 Claims, 4 Drawing Sheets

SELF-DIAGNOSTIC APPARATUS AND METHOD FOR ELECTRIC DEVICE

CROSS-REFERENCE TO RELATED APPLICATIONS

This application claims the benefit of Korean Patent Application No. 2012-0000844, filed on Jan. 4, 2012 in the Korean Intellectual Property Office, the disclosure of which is incorporated herein by reference.

BACKGROUND

1. Field

One or more embodiments relate to a self-diagnostic apparatus and a method for an electric device configured to diagnose whether abnormal power consumption has occurred in the electric device.

2. Description of the Related Art

A self-diagnostic apparatus and a method for an electric device are configured to diagnose and determine by the electric device itself whether the electric device is operating normally. For example, through the detection of an abnormal output at one or more sensors, the detection of a feedback voltage at a direct current (DC) load, and the detection of a zero cross at an alternating current (AC) load, the determination is made whether the electric device, that is, the load, is normal.

As for a heater, which is one of the loads that are commonly used in an electric device, a defect of the heater is difficult to diagnose immediately, and an early completion of a timed operation or a time-out of an operation is detected as an error of the heater. Because of the above, in a case when a defect of the heater is to be corrected, the defect is confirmed by disconnecting the electric device and re-measuring the load of the heater. In such a case, diagnosis takes additional time, and when the characteristics of the heater are changed it is difficult to locate the defect.

SUMMARY

Therefore, it is an aspect of one or more embodiments to enable a self-diagnosis to be easily performed at a load side to detect the occurrence of the abnormal electricity usage at the load by using a simple apparatus comprising a current sensor.

Additional aspects and/or advantages of one or more embodiments will be set forth in part in the description which follows and, in part, will be apparent from the description, or may be learned by practice of one or more embodiments of disclosure. One or more embodiments are inclusive of such additional aspects.

In accordance with one or more embodiments, a method of diagnosing an electric device is as follows. Rated power consumption of a load may be checked. Power consumption of the load in operation may be measured. A change in the power consumption may be calculated by comparing the rated power consumption of the load with the power consumption of the load in operation. An abnormal power consumption occurring at the load may be determined when the change in the power consumption is outside a predetermined range.

In the measuring of the power consumption of the load in operation, a current value of electric power that is supplied to the load may be measured using a current detector, and the power consumption of the load may be calculated based on the measured current value.

In a case when a plurality of loads are provided, while operating one of the plurality of loads, the change in the power consumption may be calculated by comparing the rated power consumption of the load with the power consumption of the load in operation, and when the change in the power consumption is outside the predetermined range, the determination may be made that an abnormal power consumption has occurred at the load that is in operation.

The diagnosing may be performed in sequence on each of the plurality of loads.

The power consumption of the load in operation may be provided from a current sensor, which may be provided on a power cable that supplies power to the load and may be configured to measure the current of an electric power that is being supplied to the load through the electrical cable.

The current sensor may be a sensor used in at least one of a temperature current (TC) sensor scheme, a dummy resistor scheme that uses a voltage drop by a current, and a hall sensor scheme.

In accordance with one or more embodiments, an apparatus for diagnosing an electric device may include a current measurer and a controller. The current measurer may be configured to measure an amount of current that is being supplied to a load while the load is in operation. The controller may be configured to measure a power consumption of the load in operation based on the amount of the current that is measured through the current measurer, to calculate a change in the power consumption by comparing the power consumption of the load in operation with a rated power consumption of the load, and to determine that an abnormal power consumption has occurred at the load when the change in the power consumption is outside a predetermined range.

The current measurer may be a current sensor, which may be provided at a power cable that supplies power to the load and may be configured to measure the amount of the current of the power that is being supplied to the load through the power cable.

The current sensor may be a sensor used in at least one of a temperature current (TC) sensor scheme, a dummy resistor scheme that uses a voltage drop by a current, and a hall sensor scheme.

As described above, by enabling self-diagnosis to be easily performed at the load side to detect abnormal electrical current at the load by using a simple apparatus having the basis of a current sensor, monitoring may be performed while the load is in operation without having to disassemble the electric device, and thus, the application of the above may be easily made at a mass production line of the electrical device, as well as at the time of servicing the electrical device, and because the monitoring is performed on the basis of the overall power consumption, no additional costs are incurred by each load.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
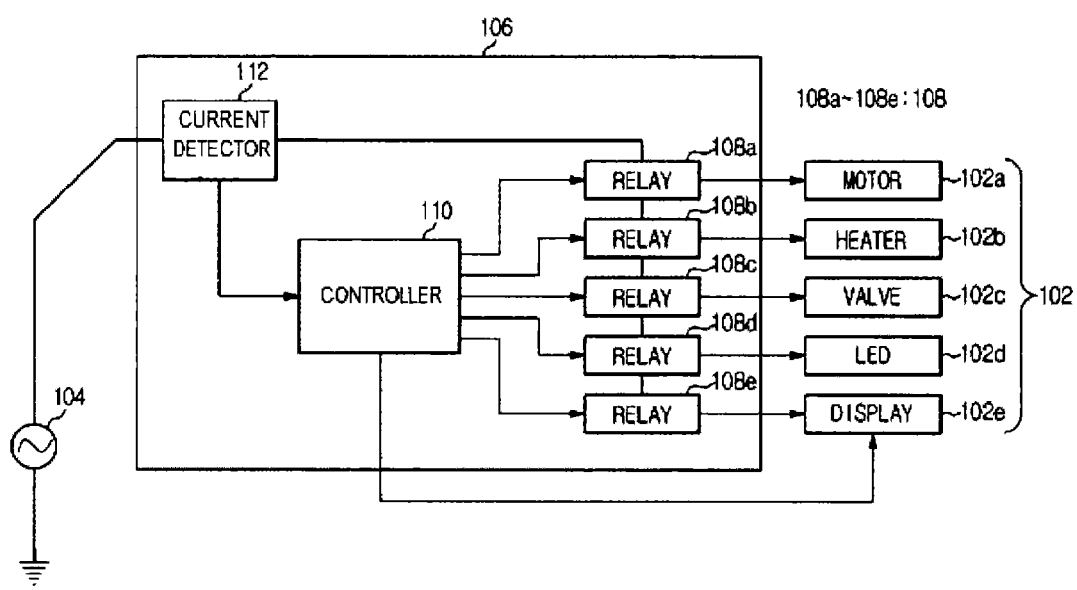
FIG. 1 illustrates a diagnostic apparatus of an electrical device according to one or more embodiments.

Reference will now be made in detail to one or more embodiments, illustrated in the accompanying drawings, wherein like reference numerals refer to like elements throughout. In this regard, embodiments of the present invention may be embodied in many different forms and should not be construed as being limited to embodiments set forth herein, as various changes, modifications, and equivalents of the systems, apparatuses and/or methods described herein will be understood to be included in the invention by those of ordinary skill in the art after embodiments discussed herein are understood. Accordingly, embodiments are merely described below, by referring to the figures, to explain aspects of the present invention.

FIG. 1 is a drawing showing a diagnostic apparatus of an electrical device according to one or more embodiments. As shown on FIG. 1, a load 102 is supplied with power from a power supply 104. Here, the load 102, for example, may be a motor 102a, a heater 102b, a valve 102c, a LED 102d, and a display 102e that compose, for example, a refrigerator, and the load 102 may vary depending on the type of an electrical device.

A diagnostic apparatus 106 may be provided with a plurality of relays 108 including a first relay 108a, a second relay 108b, a third relay 108c, a fourth relay 108d and a fifth relay 108e, and through each of the plurality of relays 108, power may be supplied to each of the loads 102. That is, for example, when the first relay 108a is turned ON, power may be provided to the motor 102a, and when the second relay 108b is turned ON, power may be provided to the heater 102b. Likewise, for example, when the third relay 108c is turned ON, power may be provided to the valve 102c, when the fourth relay 108d is turned ON, power may be supplied to the LED 102d, and when the fifth relay 108e is turned ON, power may be provided to the display 102e.

The ON/OFF for each relay of the plurality of relays 108 may be controlled by a controller 110. The controller 110 may be capable of controlling the power to be supplied only to a desired one of the plurality of loads 102a, 102b, 102c, 102d, and 102e, by selectively controlling the ON/OFF of each relay of the plurality of relays 108, and if needed, the controller 110 may control the power to be supplied to more than two loads of the plurality of loads 102a, 102b, 102c, 102d, and 102e. Through the control as such, the power may be controlled to be sequentially supplied to each relay of the plurality of relays 108. For example, among the plurality of loads 102, the controller 110 may supply power to the motor 102a, and then, after stopping the supply of the power to the motor 102a, the controller 110 may supply power to the heater 102b only. Likewise, power may be supplied to each of the valve 102c, the LED 102d, and the display 102e alone by the controller 110.

A current detector 112 may be provided on a power cable positioned between the power supply 104 and the relay 108, and may be configured to measure the current level supplied through the power cable to the load 102. The current detector 112 may measure the current level supplied toward the load 102, and may provide a value that corresponds to the measured amount of the current, that is, a current value, to the controller 110. The controller 110 may receive the current value that is provided from the current detector 112, and on the basis of the current value, may measure (calculate) the amount of the power consumption at the load 102.

The current detector 112 may be, for example, one of a Temperature Current (TC) sensor method sensor, a dummy resistance method sensor that uses a voltage drop by a current, and a hall sensor method sensor.

The controller 110, by using the relay 108 and the current detector 112, may measure the amount of the power consumption at each of the loads of the plurality of loads 102. That is, by turning ON the first replay 108a among the plurality of relays 108, power may be supplied only to the motor 102a among the plurality of loads 102 (at this time, the motor 102a is in operation), and at this time, the controller 110 may receive the current value provided from the current detector 112, and on the basis of the current value above, the amount of the power supplied through the present power cable may be calculated, so that the amount of the power consumption, while the motor 102a is in operation, may be measured. Through the method, the amount of the power consumption at the each load of the plurality of loads 102, while each load is in operation, may be measured.

The controller 110, by measuring the amount of the power consumption with respect to each load of the plurality of loads 102 in operation, may check whether abnormal power consumption has occurred at the each load of the plurality of loads 102. Here, the abnormal power consumption may indicate that the change in the power consumption at the each load of the plurality of loads 102 is outside a normal range. It may be assumed that the change in the power consumption of the load 102 in operation represents the difference between the amount of the rated power consumption at the each load and the amount of the power consumption at the each load. If the range of the change in the power consumption is below or exceeds a predetermined range, it may be determined that there is an abnormality in the load 102.

Data about the rated power consumption of the each load of the plurality of loads 102 and data about the predetermined range may be provided in advance in the form of a look-up table at the controller 110. The data about the rated power consumption of the each load of the plurality of loads 102 may be provided from the manufacturer of the corresponding load 102, or may be obtained through an experiment, for example. The data about the predetermined range may also be obtained through experiment.

Figure 2:
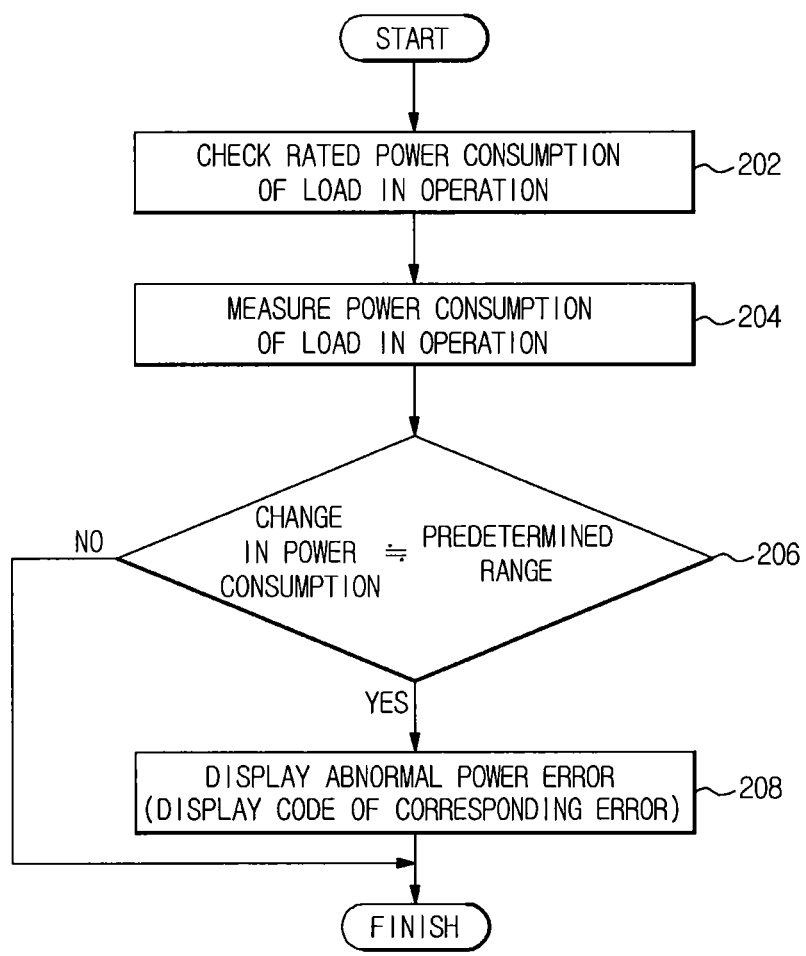
FIG. 2 illustrates a diagnostic method of an electrical device according to one or more embodiments.

FIG. 2 illustrates a diagnostic method of an electrical device according to one or more embodiments. The diagnostic method of an electrical device shown in FIG. 2 is an example where a diagnosis is performed on a load, which is currently in operation. First, the controller 110 may check the rated power consumption of the load 102 in operation (202). In addition, the controller 110 may measure the power consumption of the load 102, which is in operation (204). The power consumption of the load 102 while in operation may be measured on the basis of the amount of the current that is detected through the current detector 112. The controller 110, through the comparison of the rated power consumption of the load 102 with the power consumption in operation, may calculate the change in the power consumption, and by comparing the change in the power consumption of the load 102 with the predetermined range provided in advance, the controller 110 may check whether the change in the power consumption of the load 102 is outside the predetermined range (206). If the change in the power consumption of the load 102 is outside the predetermined range ('YES' at operation 206), the controller 110 may determine that abnormal power consumption has occurred at the corresponding load 102, and may determine that an error occurs at the load 102, the controller 110 may display an error through the display 102e. At this time, by displaying an inherent code of the corresponding load 102, an administrator or a user may be informed which one of the plurality of loads 102 has an error. On the contrary, if the change in the power consumption of the load 102 is not outside the predetermined range ('NO' at operation 206), the controller 110 may determine that the corresponding load 102 is operating normally, and may complete the diagnosis.

Figure 3:
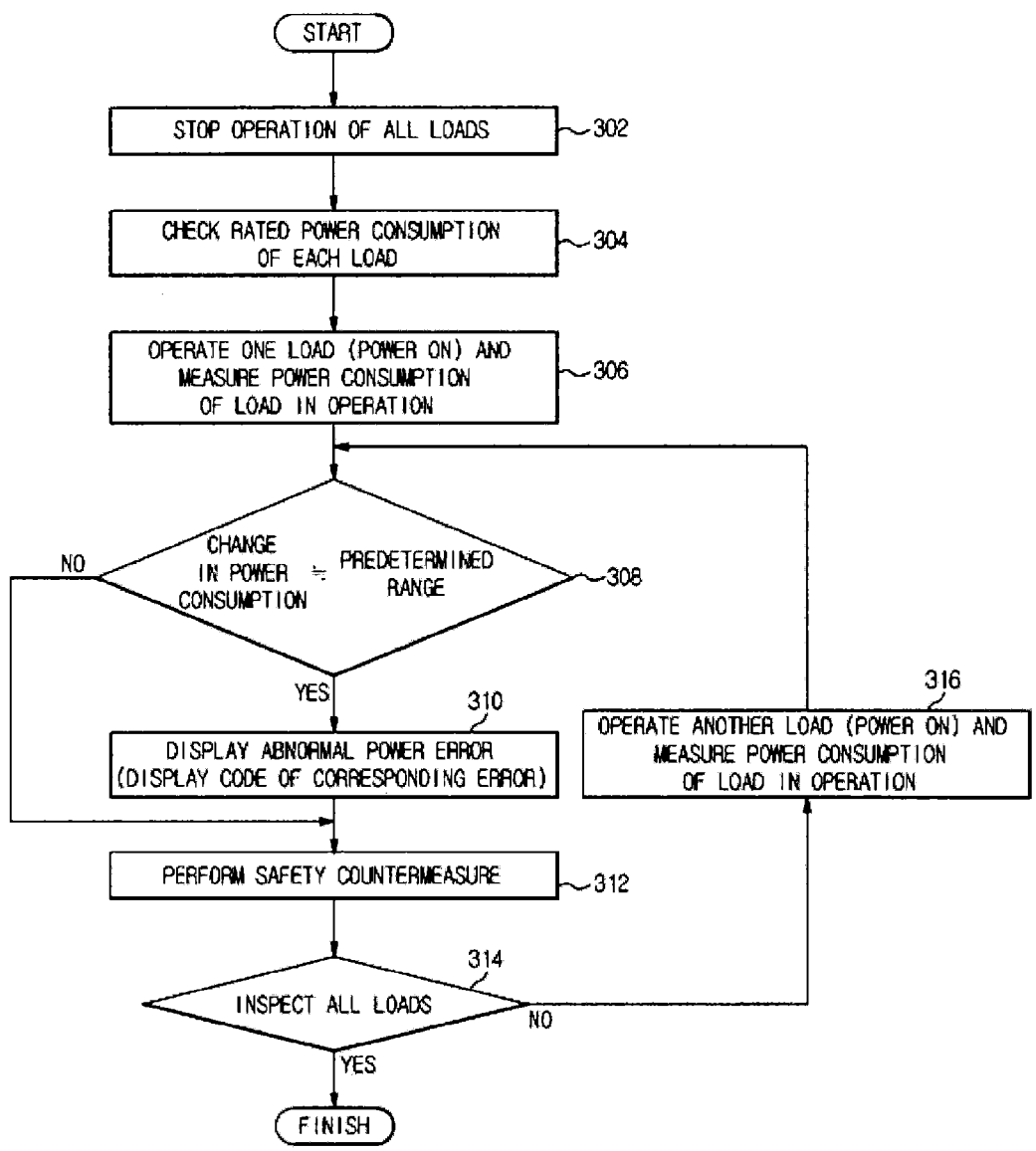
FIG. 3 illustrates a diagnostic method of an electrical device according to one or more embodiments.

FIG. 3 illustrates a diagnostic method of an electrical device according to one or more embodiments. The diagnostic method of an electrical device shown in FIG. 3 is an example of sequentially diagnosing a plurality of loads in a non-operation by sequentially operating the plurality of loads.

First, the controller 110 may stop operating all of the plurality of loads 102 (302) so as to measure the power consumption of only one load 102 in operation by operating only one load 102 at a time. Next, the controller 110 may check the rated power consumption of each load of the plurality of loads 102 (304). The controller 110 may control the plurality of loads such that that one of the plurality of load 102 is operated (power ON), and may measure the power consumption of the corresponding load 102 while the corresponding load 102 is in operation (306). The power consumption of the load 102 in operation may be measured on the basis of the amount of current that is detected through the current detector 112. The controller 110 may calculate the change in the power consumption through a comparison of the rated power consumption of the load 102 in operation with the power consumption of the load 102 in operation, and by comparing the change in the power consumption of the load 102 with a predetermined range provided in advance, the controller 110 may check whether the change in the power consumption of the load 102 is outside the predetermined range (308). If the change in the power consumption of the corresponding load 102 is outside the predetermined range ('YES' from 308), the controller 110 may determine that abnormal power consumption has occurred at the corresponding load 102, and may determine that the error occurs at the load 102, the controller 110 may display an error through the display 102e (310). At this time, by displaying an inherent code of the corresponding load 102, an administrator or a user may be informed which one of the plurality of load 102 has an error.

If an error of the corresponding load 102 is determined, the controller 110 may perform a safety countermeasure (312). That is, the controller 110 may check whether a block having the load 102 with the error may critically affect the overall operation of the electrical device, and if found that the critical effect is anticipated, the safety measure including the shutting down of the electrical device may be performed. Alternatively, the controller 110 may also check whether the corresponding error is a temporary or a continuous error through an inspection while the operation of the corresponding load 102 is stopped for a predetermined period of time, and if the error is found to be the continuous error, may take the proper safety action, may convert the status of the electrical device, and may guide a user to perform a safety action, such as an error notification or a guide on actions needed to be taken place. In addition, even in a case when the corresponding error is temporary, if the frequency of the occurrence of the error is high, the controller 110 may convert the status of the electrical device and guide a user to perform a safety action, such as an error notification or a guide on actions needed to be taken place. On the contrary, if the change in the power consumption of the corresponding load 102 is not outside the predetermined range ('NO' at operation 308), the controller 110 may determine that the corresponding load 102 is operating normally, and may stop the operation of the corresponding load 102 (312). The diagnosis may be performed with respect to all of the loads 102 (314), and if there are any of the loads 102 remaining to be diagnosed ('NO' at operation 314), the controller 110 may control another one of the loads 102 to operate (power-ON) and may measure the power consumption of the corresponding load 102 in operation (316). Subsequently, by returning to operation 308 of comparing the change in the power consumption of the load 102 with the predetermined range, the process above may be repeated.

Figure 4:
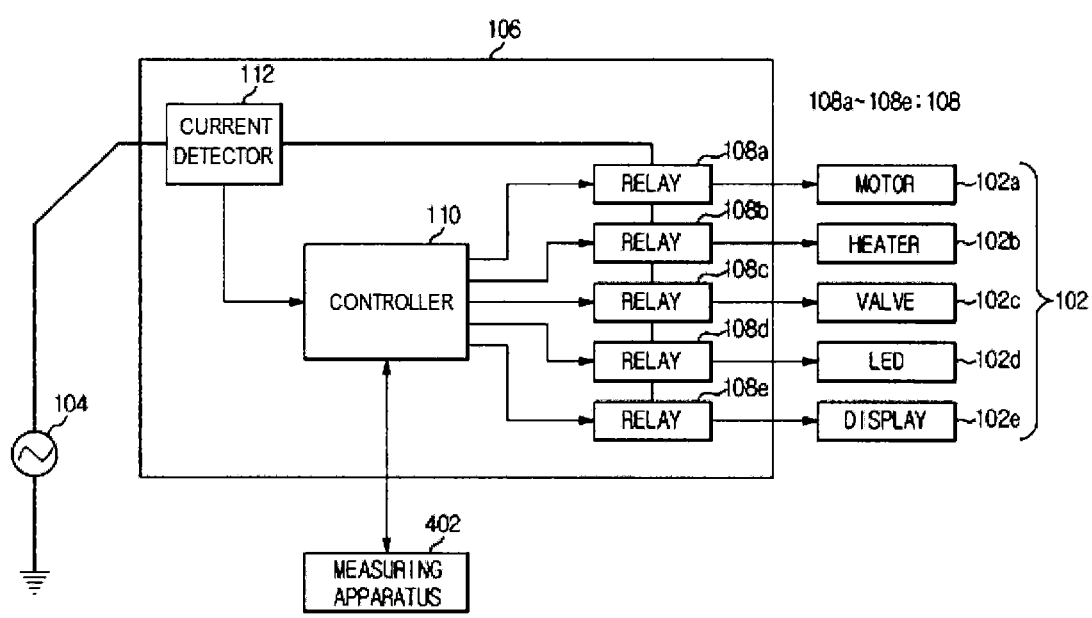
FIG. 4 illustrates a diagnostic apparatus of an electrical device according to one or more embodiments.

FIG. 4 illustrates a diagnostic apparatus of an electrical device according to one or more embodiments. The diagnostic apparatus of an electrical device shown on FIG. 4 illustrates one or more embodiments in which a measuring apparatus 402 is connected to the controller 110 to display the error and the code of the load 102 through the measuring apparatus 402 in a case when a display is not provided at the electrical device. The other components except for the communication connection between the controller 110 and the measuring apparatus 402 are otherwise identical to that of those as described in FIG. 1 and therefore, a detailed description will be omitted.

In one or more embodiments, any apparatus, system, element, or interpretable unit descriptions herein include one or more hardware devices or hardware processing elements. For example, in one or more embodiments, any described apparatus, system, element, retriever, pre or post-processing elements, tracker, detector, encoder, decoder, etc., may further include one or more memories and/or processing elements, and any hardware input/output transmission devices, or represent operating portions/aspects of one or more respective processing elements or devices. Further, the term apparatus should be considered synonymous with elements of a physical system, not limited to a single device or enclosure or all described elements embodied in single respective enclosures in all embodiments, but rather, depending on embodiment, is open to being embodied together or separately in differing enclosures and/or locations through differing hardware elements.

In addition to the above described embodiments, embodiments can also be implemented through computer readable code/instructions in/on a non-transitory medium, e.g., a computer readable medium, to control at least one processing device, such as a processor or computer, to implement any above described embodiment. The medium can correspond to any defined, measurable, and tangible structure permitting the storing and/or transmission of the computer readable code.

The media may also include, e.g., in combination with the computer readable code, data files, data structures, and the like. One or more embodiments of computer-readable media include: magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Computer readable code may include both machine code, such as produced by a compiler, and files containing higher level code that may be executed by the computer using an interpreter, for example. The media may also be any defined, measurable, and tangible distributed network, so that the computer readable code is stored and executed in a distributed fashion. Still further, as only an example, the processing element could include a processor or a computer processor, and processing elements may be distributed and/or included in a single device.

The computer-readable media may also be embodied in at least one application specific integrated circuit (ASIC) or Field Programmable Gate Array (FPGA), as only examples, which execute (e.g., processes like a processor) program instructions.

While aspects of the present invention has been particularly shown and described with reference to differing embodiments thereof, it should be understood that these embodiments should be considered in a descriptive sense only and not for purposes of limitation. Descriptions of features or aspects within each embodiment should typically be considered as available for other similar features or aspects in the remaining embodiments. Suitable results may equally be achieved if the described techniques are performed in a different order and/or if components in a described system, architecture, device, or circuit are combined in a different manner and/or replaced or supplemented by other components or their equivalents.

Thus, although a few embodiments have been shown and described, with additional embodiments being equally available, it would be appreciated by those skilled in the art that changes may be made in these embodiments without departing from the principles and spirit of the invention, the scope of which is defined in the claims and their equivalents.

What is claimed is:

1. A method of diagnosing electric device, the method comprising:
   checking a rated power consumption of at least two operated loads by searching a lookup table;
   supplying power to each of the at least two operated loads individually by operating at least one switch, which is controlled by a processor, to route the power to each of the at least two operated loads individually;
   measuring a power consumption of each of the at least two operated loads when the power is supplied to each of the at least two operated loads individually,
   wherein the measuring of the power consumption of each of the at least two operated loads includes measuring a current value of the power supplied to each of the at least two operated loads individually using a current detector;
   calculating, using the processor, a change in the power consumption by comparing the checked rated power consumption of each of the at least two operated loads with the measured power consumption of the at least two operated loads; and
   determining, using the processor, that an abnormal power consumption occurs in one or more of the at least two operated loads based on the calculated change in the power consumption being outside a predetermined range in the one or more of the at least two operated loads.

2. The diagnostic method of claim 1,
   wherein the power consumption of each of the at least two operated loads are calculated based on the measured current value of each of the at least two operated loads.

3. The diagnostic method of claim 1,
   wherein the determining that the abnormal power consumption occurs is performed in sequence for each of the at least two operated loads based on measuring power consumption of each of the plurality of loads when the power is supplied to each of the at least two operated loads.

4. The diagnostic method of claim 1, wherein the power consumption of the at least two operated loads is measured using a current sensor, the current sensor being provided on a power cable that supplies the power to the at least two operated loads, and the current sensor being configured to measure the current value of the power supplied to one of the at least two operated loads through the electrical cable without supplying current to another one of the at least two operated loads.

5. The diagnostic method of claim 1,
   wherein said supply of power is performed by at least three switches which supply the power to at least four operated loads individually.

6. The diagnostic method of claim 4, wherein the current sensor is a sensor used in at least one of a temperature current (TC) sensor scheme, a dummy resistor scheme that uses a voltage drop by a current, and a hail sensor scheme.

* * * * *